n(12) United States Patent
Yasuda

(10) Patent No.: US 10,447,235 B2
(45) Date of Patent: Oct. 15, 2019

(54) ELASTIC WAVE DEVICE AND METHOD FOR MANUFACTURING THE SAME

(71) Applicant: Murata Manufacturing Co., Ltd., Nagaokakyo-shi, Kyoto-fu (JP)

(72) Inventor: Junpei Yasuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 16/282,846

(22) Filed: Feb. 22, 2019

(65) Prior Publication Data

US 2019/0190487 A1 Jun. 20, 2019

Related U.S. Application Data

(63) Continuation of application No. PCT/JP2017/030969, filed on Aug. 29, 2017.

(30) Foreign Application Priority Data

Aug. 30, 2016 (JP) ................................. 2016-168413

(51) Int. Cl.
*H03H 9/145* (2006.01)
*H03H 9/64* (2006.01)
(Continued)

(52) U.S. Cl.
CPC .......... *H03H 9/14538* (2013.01); *H03H 3/08* (2013.01); *H03H 9/64* (2013.01);
(Continued)

(58) Field of Classification Search
CPC .... H03H 9/14538; H03H 9/64; H03H 9/6436; H03H 9/6483; H03H 9/725; H03H 3/08
See application file for complete search history.

(56) References Cited

U.S. PATENT DOCUMENTS 5,731,748 A 3/1998 Tada
6,516,503 B1 * 2/2003 Ikada ....................... H03H 3/08
216/79
(Continued)

FOREIGN PATENT DOCUMENTS

JP 7-283682 A 10/1995
JP 2000-341068 A 12/2000
(Continued)

OTHER PUBLICATIONS

Official Communication issued in International Patent Application No. PCT/JP2017/030969, dated Nov. 14, 2017.

*Primary Examiner* — Stephen E. Jones
*Assistant Examiner* — Samuel S Outten
(74) *Attorney, Agent, or Firm* — Keating & Bennett, LLP

(57) ABSTRACT

An elastic wave device includes a first band-pass filter on a piezoelectric substrate and including first IDT electrodes and a first dielectric film, and a second band-pass filter on the piezoelectric substrate and including second IDT electrodes and a second dielectric film. At least one pair among a pair of the first and second IDT electrodes and a pair of the first and second dielectric films has the same or substantially the same film thickness and is made of the same material. A relationship $|Tx1-Rx1|/f1 > |Tx2-Rx2|/f2$ is satisfied. A weighted average of duty ratios of the first IDT electrodes is larger than a weighted average of duty ratios of the second IDT electrodes.

20 Claims, 5 Drawing Sheets

(51) Int. Cl.
*H03H 3/08* (2006.01)
*H03H 9/72* (2006.01)

(52) U.S. Cl.
CPC ........ *H03H 9/6436* (2013.01); *H03H 9/6483* (2013.01); *H03H 9/725* (2013.01)

(56) References Cited

U.S. PATENT DOCUMENTS

| | | |
|---|---|---|
| 9,136,817 B2 * | 9/2015 | Tsutsumi ............... H03H 7/463 |
| 2003/0038562 A1 | 2/2003 | Ikada et al. |
| 2017/0085248 A1 | 3/2017 | Miyamoto |

FOREIGN PATENT DOCUMENTS

| | | |
|---|---|---|
| JP | 2012-175315 A | 9/2012 |
| WO | 2014/208145 A1 | 12/2014 |
| WO | 2015/190178 A1 | 12/2015 |

\* cited by examiner

ELASTIC WAVE DEVICE AND METHOD FOR MANUFACTURING THE SAME

CROSS REFERENCE TO RELATED APPLICATIONS

This application claims the benefit of priority to Japanese Patent Application No. 2016-168413 filed on Aug. 30, 2016 and is a Continuation Application of PCT Application No. PCT/JP2017/030969 filed on Aug. 29, 2017. The entire contents of each of these applications are hereby incorporated herein by reference.

BACKGROUND OF THE INVENTION

1. Field of the Invention

The present invention relates to an elastic wave device and a method for manufacturing the same.

2. Description of the Related Art

Elastic wave devices have been widely used in cellular phones and the like. In an elastic wave device described in Japanese Unexamined Patent Application Publication No. 2000-341068, two surface acoustic wave elements having different frequency characteristics are provided on the same piezoelectric substrate. An insulating film is disposed over the piezoelectric substrate so as to cover IDT electrodes of the surface acoustic wave elements. Portions of the insulating film corresponding to the two surface acoustic wave elements have different film thicknesses to adjust the frequency characteristics of the elastic wave devices.

In an elastic wave device, manufacturing variations in the line width or film thickness of electrode fingers of IDT electrodes cause variations in frequency characteristics. This may deteriorate filter characteristics, such as insertion loss and out-of-band attenuation.

In an elastic wave device including a plurality of surface acoustic wave elements, such as that described in Japanese Unexamined Patent Application Publication No. 2000-341068, frequency variations differ between the surface acoustic wave elements during manufacturing. Thus, separate frequency adjustment is required for each of the surface acoustic wave elements. This leads to a complex process for manufacturing, in particular, an elastic wave device or the like including a plurality of band-pass filters.

SUMMARY OF THE INVENTION

Preferred embodiments of the present invention provide elastic wave devices and methods for manufacturing the same that each are able to facilitate frequency adjustment of a plurality of band-pass filters provided on the same piezoelectric substrate.

According to a preferred embodiment of the present invention, an elastic wave device includes a piezoelectric substrate, a first band-pass filter including a plurality of first IDT electrodes disposed on the piezoelectric substrate, and a first dielectric film disposed on the piezoelectric substrate so as to cover the plurality of first IDT electrodes, the first band-pass filter including a pass band within a first communication band including a first transmit band and a first receive band, the pass band corresponding to the first transmit band or the first receive band, and a second band-pass filter including a plurality of second IDT electrodes disposed on the piezoelectric substrate, and a second dielectric film disposed on the piezoelectric substrate so as to cover the plurality of second IDT electrodes, the second band-pass filter including a pass band within a second communication band different from the first communication band and including a second transmit band and a second receive band, the pass band corresponding to the second transmit band or the second receive band. At least one pair among a pair of the first and second IDT electrodes and a pair of the first and second dielectric films has the same or substantially the same film thickness and is made of the same material. When a frequency at an end of the first transmit band in the first communication band closest to the first receive band is represented by $Tx1$, a frequency at an end of the first receive band in the first communication band closest to the first transmit band is represented by $Rx1$, a center frequency of the pass band of the first band-pass filter is represented by $f1$, a frequency at an end of the second transmit band in the second communication band closest to the second receive band is represented by $Tx2$, a frequency at an end of the second receive band in the second communication band closest to the second transmit band is represented by $Rx2$, and a center frequency of the pass band of the second band-pass filter is represented by $f2$, then $|Tx1-Rx1|/f1 > |Tx2-Rx2|/f2$ is satisfied. A weighted average of duty ratios of the plurality of first IDT electrodes is larger than a weighted average of duty ratios of the plurality of second IDT electrodes.

In an elastic wave device according to a preferred embodiment of the present invention, the duty ratios of all the first IDT electrodes are larger than the duty ratios of all the second IDT electrodes. In this case, the frequency adjustment of the first and second band-pass filters is able to be more easily performed.

An elastic wave device according to a preferred embodiment of the present invention includes a piezoelectric substrate, a first band-pass filter including a plurality of first IDT electrodes disposed on the piezoelectric substrate, and a first dielectric film disposed on the piezoelectric substrate so as to cover the plurality of first IDT electrodes, the first band-pass filter including a pass band within a first communication band including a first transmit band and a first receive band, the pass band corresponding to the first transmit band or the first receive band, and a second band-pass filter including a plurality of second IDT electrodes disposed on the piezoelectric substrate, and a second dielectric film disposed on the piezoelectric substrate so as to cover the plurality of second IDT electrodes, the second band-pass filter including a pass band within a second communication band different from the first communication band and including a second transmit band and a second receive band, the pass band corresponding to the second transmit band or the second receive band. At least one pair among a pair of the first and second IDT electrodes and a pair of the first and second dielectric films has the same or substantially the same film thickness and is made of the same material. When a frequency at an end of the first transmit band in the first communication band closest to the first receive band is represented by $Tx1$, a frequency at an end of the first receive band in the first communication band closest to the first transmit band is represented by $Rx1$, a center frequency of the pass band of the first band-pass filter is represented by $f1$, a frequency at an end of the second transmit band in the second communication band closest to the second receive band is represented by $Tx2$, a frequency at an end of the second receive band in the second communication band closest to the second transmit band is represented by $Rx2$, and a center frequency of the pass band of the second band-pass filter is represented by f2, then |Tx1−Rx1|/f1>|Tx2−Rx2|/f2 is satisfied. Another pass band within the first communication band, among the first transmit band and the first receive band, is located in a higher frequency range than a frequency range of the pass band of the first band-pass filter. Another pass band within the second communication band, among the second transmit band and the second receive band, is located in a higher frequency range than a frequency range of the pass band of the second band-pass filter. The first band-pass filter includes an input end and an output end, and includes one or more first elastic wave resonators that include at least one of elastic wave resonators disposed in a series arm connecting the input end and the output end of the first band-pass filter to each other. The second band-pass filter includes an input end and an output end, and includes one or more second elastic wave resonators that include at least one of elastic wave resonators disposed in a series arm connecting the input end and the output end of the second band-pass filter to each other. A weighted average of duty ratios of the first IDT electrodes included in the one or more first elastic wave resonators is larger than a weighted average of duty ratios of the second IDT electrodes included in the one or more second elastic wave resonators.

In an elastic wave device according to a preferred embodiment of the present invention, the duty ratios of the first IDT electrodes included in all of the one or more first elastic wave resonators are larger than the duty ratios of the second IDT electrodes included in all of the one or more second elastic wave resonators. In this case, the frequency adjustment of the first and second band-pass filters is able to be more easily performed.

An elastic wave device according to a preferred embodiment of the present invention includes a piezoelectric substrate, a first band-pass filter including a plurality of first IDT electrodes disposed on the piezoelectric substrate, and a first dielectric film disposed on the piezoelectric substrate so as to cover the plurality of first IDT electrodes, the first band-pass filter including a pass band within a first communication band including a first transmit band and a first receive band, the pass band corresponding to the first transmit band or the first receive band, and a second band-pass filter including a plurality of second IDT electrodes disposed on the piezoelectric substrate, and a second dielectric film disposed on the piezoelectric substrate so as to cover the plurality of second IDT electrodes, the second band-pass filter including a pass band within a second communication band different from the first communication band and including a second transmit band and a second receive band, the pass band corresponding to the second transmit band or the second receive band. At least one pair among a pair of the first and second IDT electrodes and a pair of the first and second dielectric films has the same or substantially the same film thickness and is made of the same material. When a frequency at an end of the first transmit band in the first communication band closest to the first receive band is represented by Tx1, a frequency at an end of the first receive band in the first communication band closest to the first transmit band is represented by Rx1, a center frequency of the pass band of the first band-pass filter is represented by f1, a frequency at an end of the second transmit band in the second communication band closest to the second receive band is represented by Tx2, a frequency at an end of the second receive band in the second communication band closest to the second transmit band is represented by Rx2, and a center frequency of the pass band of the second band-pass filter is represented by f2, then |Tx1−Rx1|/f1>|Tx2−Rx2|/f2 is satisfied. Another pass band within the first communication band, among the first transmit band and the first receive band, is located in a lower frequency range than a frequency range of the pass band of the first band-pass filter. Another pass band within the second communication band, among the second transmit band and the second receive band, is located in a lower frequency range than a frequency range of the pass band of the second band-pass filter. The first band-pass filter includes an input end and an output end, and includes one or more third elastic wave resonators that include at least one of elastic wave resonators connected between a series arm connecting the input end and the output end of the first band-pass filter to each other and a ground potential. The second band-pass filter includes an input end and an output end, and includes one or more fourth elastic wave resonators that include at least one of elastic wave resonators connected between a series arm connecting the input end and the output end of the second band-pass filter to each other and the ground potential. A weighted average of duty ratios of the first IDT electrodes included in the one or more third elastic wave resonators is larger than a weighted average of duty ratios of the second IDT electrodes included in the one or more fourth elastic wave resonators.

In an elastic wave device according to a preferred embodiment of the present invention, the duty ratios of the first IDT electrodes included in all of the one or more third elastic wave resonators are larger than the duty ratios of the second IDT electrodes included in all of the one or more fourth elastic wave resonators. In this case, the frequency adjustment of the first and second band-pass filters is able to be more easily performed.

An elastic wave device according to a preferred embodiment of the present invention includes a piezoelectric substrate, a first band-pass filter including a plurality of first IDT electrodes disposed on the piezoelectric substrate, and a first dielectric film disposed on the piezoelectric substrate so as to cover the plurality of first IDT electrodes, the first band-pass filter including a pass band within a first communication band including a first transmit band and a first receive band, the pass band corresponding to the first transmit band or the first receive band, and a second band-pass filter including a plurality of second IDT electrodes disposed on the piezoelectric substrate, and a second dielectric film disposed on the piezoelectric substrate so as to cover the plurality of second IDT electrodes, the second band-pass filter including a pass band within a second communication band different from the first communication band and including a second transmit band and a second receive band, the pass band corresponding to the second transmit band or the second receive band. At least one pair among a pair of the first and second IDT electrodes and a pair of the first and second dielectric films has the same or substantially the same film thickness and is made of the same material. When a frequency at an end of the first transmit band in the first communication band closest to the first receive band is represented by Tx1, a frequency at an end of the first receive band in the first communication band closest to the first transmit band is represented by Rx1, a center frequency of the pass band of the first band-pass filter is represented by f1, a frequency at an end of the second transmit band in the second communication band closest to the second receive band is represented by Tx2, a frequency at an end of the second receive band in the second communication band closest to the second transmit band is represented by Rx2, and a center frequency of the pass band of the second band-pass filter is represented by f2, then |Tx1−

Rx1|/f1>|Tx2−Rx2|/f2 is satisfied. Another pass band within the first communication band, among the first transmit band and the first receive band, is located in a higher frequency range than a frequency range of the pass band of the first band-pass filter. Another pass band within the second communication band, among the second transmit band and the second receive band, is located in a lower frequency range than a frequency range of the pass band of the second band-pass filter. The first band-pass filter includes an input end and an output end, and includes one or more first elastic wave resonators that include at least one of elastic wave resonators disposed in a series arm connecting the input end and the output end of the first band-pass filter to each other. The second band-pass filter includes an input end and an output end, and includes one or more fourth elastic wave resonators that include at least one of elastic wave resonators connected between a series arm connecting the input end and the output end of the second band-pass filter to each other and a ground potential. A weighted average of duty ratios of the first IDT electrodes included in the one or more first elastic wave resonators is larger than a weighted average of duty ratios of the second IDT electrodes included in the one or more fourth elastic wave resonators.

In an elastic wave device according to a preferred embodiment of the present invention, the duty ratios of the first IDT electrodes included in all of the one or more first elastic wave resonators are larger than the duty ratios of the second IDT electrodes included in all of the one or more fourth elastic wave resonators. In this case, the frequency adjustment of the first and second band-pass filters is able to be more easily performed.

An elastic wave device according to a preferred embodiment of the present invention includes a piezoelectric substrate, a first band-pass filter including a plurality of first IDT electrodes disposed on the piezoelectric substrate, and a first dielectric film disposed on the piezoelectric substrate so as to cover the plurality of first IDT electrodes, the first band-pass filter including a pass band within a first communication band including a first transmit band and a first receive band, the pass band corresponding to the first transmit band or the first receive band, and a second band-pass filter including a plurality of second IDT electrodes disposed on the piezoelectric substrate, and a second dielectric film disposed on the piezoelectric substrate so as to cover the plurality of second IDT electrodes, the second band-pass filter including a pass band within a second communication band different from the first communication band and including a second transmit band and a second receive band, the pass band corresponding to the second transmit band or the second receive band. At least one pair among a pair of the first and second IDT electrodes and a pair of the first and second dielectric films has the same or substantially the same film thickness and is made of the same material. When a frequency at an end of the first transmit band in the first communication band closest to the first receive band is represented by Tx1, a frequency at an end of the first receive band in the first communication band closest to the first transmit band is represented by Rx1, a center frequency of the pass band of the first band-pass filter is represented by f1, a frequency at an end of the second transmit band in the second communication band closest to the second receive band is represented by Tx2, a frequency at an end of the second receive band in the second communication band closest to the second transmit band is represented by Rx2, and a center frequency of the pass band of the second band-pass filter is represented by f2, then |Tx1−Rx1|/f1>|Tx2−Rx2|/f2 is satisfied. Another pass band within the first communication band, among the first transmit band and the first receive band, is located in a lower frequency range than a frequency range of the pass band of the first band-pass filter. Another pass band within the second communication band, among the second transmit band and the second receive band, is located in a higher frequency range than a frequency range of the pass band of the second band-pass filter. The first band-pass filter includes an input end and an output end, and includes one or more third elastic wave resonators that include at least one of elastic wave resonators connected between a series arm connecting the input end and the output end of the first band-pass filter to each other and a ground potential. The second band-pass filter includes an input end and an output end, and includes one or more second elastic wave resonators that include at least one of elastic wave resonators disposed in a series arm connecting the input end and the output end of the second band-pass filter to each other. A weighted average of duty ratios of the first IDT electrodes included in the one or more third elastic wave resonators is larger than a weighted average of duty ratios of the second IDT electrodes included in the one or more second elastic wave resonators.

In an elastic wave device according to a preferred embodiment of the present invention, the duty ratios of the first IDT electrodes included in all of the one or more third elastic wave resonators are larger than the duty ratios of the second IDT electrodes included in all of the one or more second elastic wave resonators.

In an elastic wave device according to a preferred embodiment of the present invention, the first and second band-pass filters are receive filters.

In an elastic wave device according to a preferred embodiment of the present invention, the first and second band-pass filters are transmit filters.

In an elastic wave device according to a preferred embodiment of the present invention, the first and second IDT electrodes have the same or substantially the same film thickness and are made of the same material, and the first and second dielectric films have the same or substantially the same film thickness and are made of the same material. In this case, productivity is able to further be improved, and the frequency adjustment of the first and second band-pass filters is able to be more easily performed.

In an elastic wave device according to a preferred embodiment of the present invention, at least one pair among the pair of the first and second IDT electrodes and the pair of the first and second dielectric films has a multi-layer film structure.

A method for manufacturing an elastic wave device according to a preferred embodiment of the present invention includes a step of preparing a piezoelectric substrate, a first IDT electrode forming step of forming a plurality of first IDT electrodes on the piezoelectric substrate, a second IDT electrode forming step of forming a plurality of second IDT electrodes on the piezoelectric substrate, a first dielectric film forming step of stacking a first dielectric film on the piezoelectric substrate so as to cover the plurality of first IDT electrodes, and a second dielectric film forming step of stacking a second dielectric film on the piezoelectric substrate so as to cover the plurality of second IDT electrodes. In the second IDT electrode forming step, the plurality of second IDT electrodes are formed, for which a weighted average of duty ratios is smaller than a weighted average of duty ratios of the plurality of first IDT electrodes. At least one pair among a pair of the first and second IDT electrode forming steps and a pair of the first and second dielectric film forming steps is simultaneously performed using the same material. The method further includes a step of simultaneously performing frequency adjustment on the first and second band-pass filters.

A method for manufacturing an elastic wave device according to a preferred embodiment of the present invention includes a step of preparing a piezoelectric substrate, a first IDT electrode forming step of forming a plurality of first IDT electrodes on the piezoelectric substrate, a second IDT electrode forming step of forming a plurality of second IDT electrodes on the piezoelectric substrate, a first dielectric film forming step of stacking a first dielectric film on the piezoelectric substrate so as to cover the plurality of first IDT electrodes, and a second dielectric film forming step of stacking a second dielectric film on the piezoelectric substrate so as to cover the plurality of second IDT electrodes. In the second IDT electrode forming step, the second IDT electrodes of one or more second elastic wave resonators are formed, for which a weighted average of duty ratios is smaller than a weighted average of duty ratios of the first IDT electrodes of one or more first elastic wave resonators. At least one pair among a pair of the first and second IDT electrode forming steps and a pair of the first and second dielectric film forming steps is simultaneously performed using the same material. The method further includes a step of simultaneously performing frequency adjustment on the first and second band-pass filters.

A method for manufacturing an elastic wave device according to a preferred embodiment of the present invention includes a step of preparing a piezoelectric substrate, a first IDT electrode forming step of forming a plurality of first IDT electrodes on the piezoelectric substrate, a second IDT electrode forming step of forming a plurality of second IDT electrodes on the piezoelectric substrate, a first dielectric film forming step of stacking a first dielectric film on the piezoelectric substrate so as to cover the plurality of first IDT electrodes, and a second dielectric film forming step of stacking a second dielectric film on the piezoelectric substrate so as to cover the plurality of second IDT electrodes. In the second IDT electrode forming step, the second IDT electrodes included in one or more fourth elastic wave resonators are formed, for which a weighted average of duty ratios is smaller than a weighted average of duty ratios of the first IDT electrodes included in one or more third elastic wave resonators. At least one pair among a pair of the first and second IDT electrode forming steps and a pair of the first and second dielectric film forming steps is simultaneously performed using the same material. The method further includes a step of simultaneously performing frequency adjustment on the first and second band-pass filters.

A method for manufacturing an elastic wave device according to a preferred embodiment of the present invention includes a step of preparing a piezoelectric substrate, a first IDT electrode forming step of forming a plurality of first IDT electrodes on the piezoelectric substrate, a second IDT electrode forming step of forming a plurality of second IDT electrodes on the piezoelectric substrate, a first dielectric film forming step of stacking a first dielectric film on the piezoelectric substrate so as to cover the plurality of first IDT electrodes, and a second dielectric film forming step of stacking a second dielectric film on the piezoelectric substrate so as to cover the plurality of second IDT electrodes. In the second IDT electrode forming step, the second IDT electrodes included in one or more fourth elastic wave resonators are formed, for which a weighted average of duty ratios is smaller than a weighted average of duty ratios of the first IDT electrodes included in one or more first elastic wave resonators. At least one pair among a pair of the first and second IDT electrode forming steps and a pair of the first and second dielectric film forming steps is simultaneously performed using the same material. The method further includes a step of simultaneously performing frequency adjustment on the first and second band-pass filters.

In a method for manufacturing an elastic wave device according to a preferred embodiment of the present invention, the first IDT electrode forming step and the second IDT electrode forming step are simultaneously performed, and the first dielectric film forming step and the second dielectric film forming step are simultaneously performed. In this case, productivity is able to be further improved, and the frequency adjustment of the first and second band-pass filters is able to be more easily performed.

In a method for manufacturing an elastic wave device according to a preferred embodiment of the present invention, steps that are simultaneously performed among the first and second IDT electrode forming steps and the first and second dielectric film forming steps are performed using a deposition method.

Preferred embodiments of the present invention provide elastic wave devices and methods for manufacturing the same that are each able to facilitate frequency adjustment of a plurality of band-pass filters provided on the same piezoelectric substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention with be described with reference to the accompanying drawings to clarify the present invention.

The preferred embodiments described herein are illustrative and components in different preferred embodiments may be partially replaced or combined.

Figure 1:
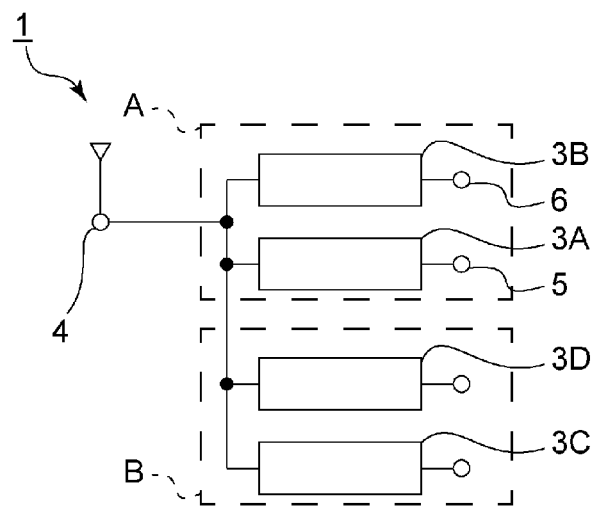
FIG. 1 is a schematic diagram of an elastic wave device according to a first preferred embodiment of the present invention.

FIG. 1 is a schematic diagram of an elastic wave device according to a first preferred embodiment of the present invention.

An elastic wave device 1 includes first, second, third, and fourth band-pass filters 3A to 3D having different pass bands. In the present preferred embodiment, the first and second band-pass filters 3A and 3B are receive filters, and the third and fourth band-pass filters 3C and 3D are transmit filters.

The first band-pass filter 3A and the third band-pass filter 3C are respectively a receive filter and a transmit filter for the same communication band. More specifically, the first band-pass filter 3A has, within a first communication band including a first receive band and a first transmit band, the first receive band as the pass band. The third band-pass filter 3C has the first transmit band, which is the other band within the first communication band, as the pass band.

Similarly, the second band-pass filter 3B and the fourth band-pass filter 3D are respectively a receive filter and a transmit filter for the same communication band. More specifically, the second band-pass filter 3B has, within a second communication band including a second receive band and a second transmit band, the second receive band as the pass band. The fourth band-pass filter 3D has the second transmit band, which is the other band within the second communication band, as the pass band.

In the present preferred embodiment, the first receive band is preferably, for example, the receive band of Band 4, which is greater than or equal to about 2110 MHz and less than or equal to about 2155 MHz. The first transmit band is preferably, for example, the transmit band of Band 4, which is greater than or equal to about 1710 MHz and less than or equal to about 1755 MHz. The second receive band is preferably, for example, the receive band of Band 25, which is greater than or equal to about 1930 MHz and less than or equal to about 1995 MHz. The second transmit band is preferably, for example, the transmit band of Band 25, which is greater than or equal to about 1850 MHz and is less than or equal to about 1915 MHz. Note that the first and second receive bands and the first and second transmit bands are not limited to those described above.

The elastic wave device 1 includes an antenna terminal 4, which is connected to an antenna. In the present preferred embodiment, the first band-pass filter 3A and the third band-pass filter 3C are connected in common to the antenna terminal 4, and the second band-pass filter 3B and the fourth band-pass filter 3D are connected in common to the antenna terminal 4. That is, the first, second, third, and fourth band-pass filters 3A to 3D are connected in common to the antenna terminal 4. Note that the first and second band-pass filters 3A and 3B may not necessarily be connected in common to the same antenna terminal. The third and fourth band-pass filters 3C and 3D may also not necessarily be connected in common to the same antenna terminal.

Here, a frequency at an end of the first transmit band closest to the first receive band is represented by Tx1, and a frequency at an end of the first receive band closest to the first transmit band is represented by Rx1. The center frequency of the pass band of the first band-pass filter 3A is represented by f1. A frequency at an end of the second transmit band closest to the second receive band is represented by Tx2, and a frequency at an end of the second receive band closest to the second transmit band is represented by Rx2. The center frequency of the pass band of the second band-pass filter 3B is represented by f2. In the present preferred embodiment, preferably $|Tx1-Rx1|/f1$=about 16.65% is satisfied and $|Tx2-Rx2|/f2$=about 0.76% is satisfied, for example. In the elastic wave device 1, therefore, $|Tx1-Rx1|/f1 > |Tx2-Rx2|/f2$ is preferably satisfied, for example. This indicates that the frequency spacing between the first transmit band and the first receive band is larger than the frequency spacing between the second transmit band and the second receive band.

In FIG. 1, a broken line A indicates that the first and second band-pass filters 3A and 3B are provided in the same chip. A broken line B indicates that the third and fourth band-pass filters 3C and 3D are provided in the same chip. The term "provided in the same chip", as used herein, refers to being provided on the same piezoelectric substrate. Note that the third and fourth band-pass filters 3C and 3D may not necessarily be provided in the same chip.

The following describes a more specific configuration of the first and second band-pass filters 3A and 3B in the present preferred embodiment.

Figure 2:
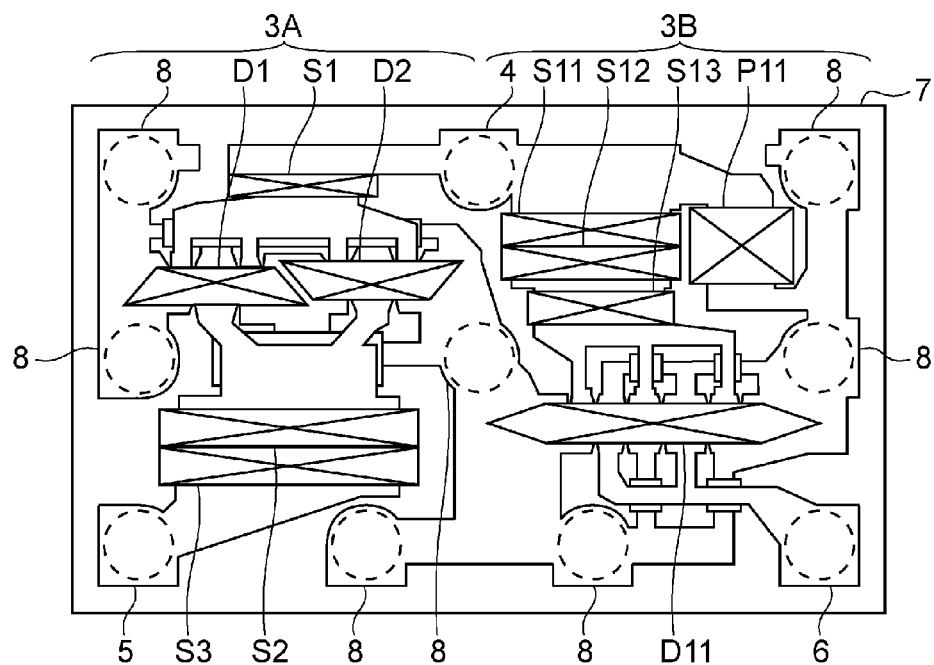
FIG. 2 is a simplified plan view illustrating an electrode structure of first and second band-pass filters in the first preferred embodiment of the present invention.
Figure 3:
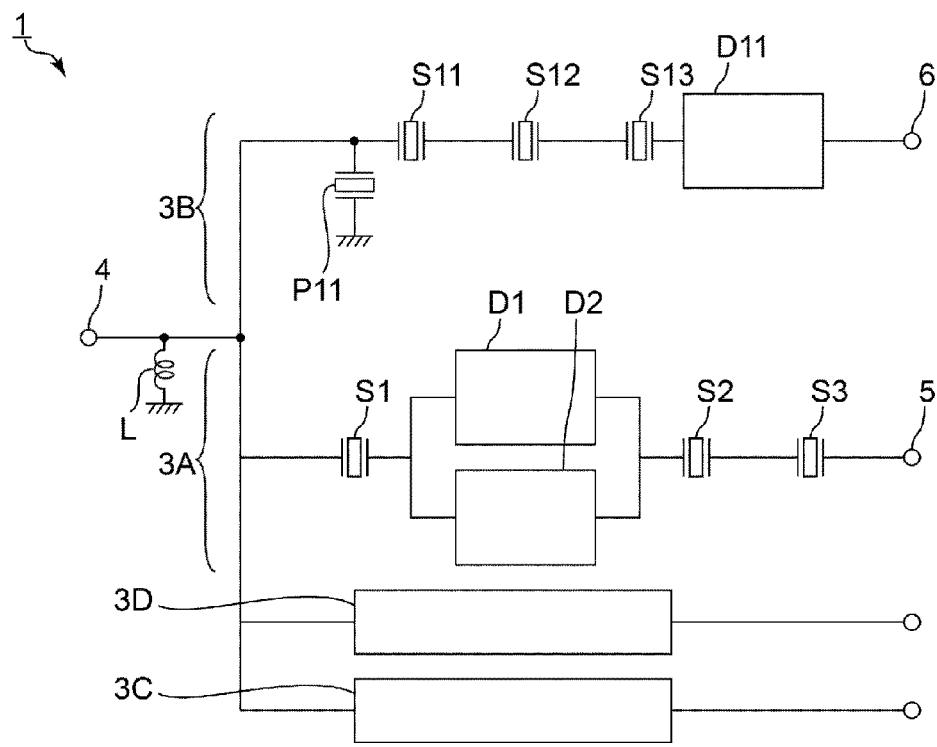
FIG. 3 is a schematic circuit diagram of the elastic wave device according to the first preferred embodiment of the present invention.

FIG. 2 is a simplified plan view illustrating an electrode structure of the first and second band-pass filters in the first preferred embodiment. FIG. 3 is a schematic circuit diagram of the elastic wave device according to the present preferred embodiment. In FIG. 2, elastic wave resonators and longitudinally coupled resonator elastic wave filters, described below, are schematically depicted as rectangles or polygons with diagonals.

As illustrated in FIG. 2, the elastic wave device of the present preferred embodiment includes a piezoelectric substrate 7. The piezoelectric substrate 7 is preferably made of, for example, piezoelectric single crystals such as $LiNbO_3$ or $LiTaO_3$ or suitable piezoelectric ceramics. The first and second band-pass filters 3A and 3B are provided on the piezoelectric substrate 7. On the piezoelectric substrate 7, a plurality of ground terminals 8, which are coupled to a ground potential, are provided.

As illustrated in FIG. 3, the first band-pass filter 3A includes a plurality of elastic wave resonators S1 to S3 and a plurality of longitudinally coupled resonator elastic wave filters D1 and D2. The second band-pass filter 3B includes a plurality of elastic wave resonators S11 to S13 and P11 and a longitudinally coupled resonator elastic wave filter D11. In contrast, the circuit configurations of the third and fourth band-pass filters 3C and 3D are not limited to specific ones.

Figure 4:
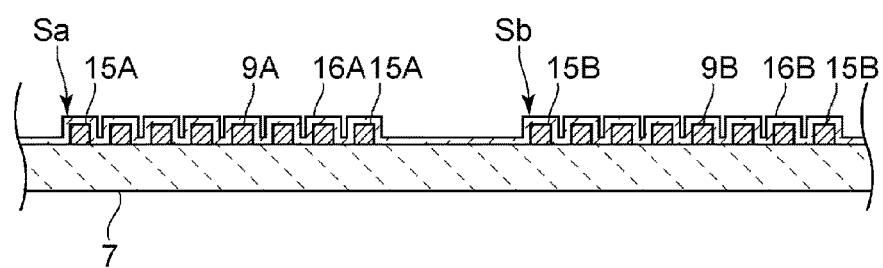
FIG. 4 is a schematic sectional view of the elastic wave device according to the first preferred embodiment of the present invention, schematically illustrating a portion of the first and second band-pass filters.

FIG. 4 is a schematic sectional view of the elastic wave device according to the first preferred embodiment, schematically illustrating a portion of the first and second band-pass filters. FIG. 4 is a schematic illustration, which does not correspond to the sectional view of a specific portion in FIG. 2. The same applies to FIGS. 6A and 6B, and FIG. 7 to FIG. 9, described below.

An elastic wave resonator Sa of the first band-pass filter includes a first IDT electrode 9A provided on the piezoelectric substrate 7. Reflectors 15A are disposed on two sides of the first IDT electrode 9A in an elastic wave propagation direction. The piezoelectric substrate 7 includes a first dielectric film 16A that covers the first IDT electrode 9A and the reflectors 15A.

An elastic wave resonator Sb of the second band-pass filter includes a second IDT electrode 9B provided on the piezoelectric substrate 7. Reflectors 15B are disposed on two sides of the second IDT electrode 9B in the elastic wave propagation direction. The piezoelectric substrate 7 includes a second dielectric film 16B that covers the second IDT electrode 9B and the reflectors 15B. The first and second dielectric films 16A and 16B are preferably made of, for example, a suitable dielectric material, such as $SiO_2$.

The first band-pass filter further includes a plurality of first IDT electrodes 9A in addition to the first IDT electrode 9A illustrated in FIG. 4. The elastic wave resonators S1 to S3 and the longitudinally coupled resonator elastic wave filters D1 and D2 illustrated in FIG. 3 each include the first IDT electrode 9A and the first dielectric film 16A. The second band-pass filter also includes a plurality of second IDT electrodes 9B. The elastic wave resonators S11 to S13 and P11 and the longitudinally coupled resonator elastic wave filter D11 each include the second IDT electrode 9B and the second dielectric film 16B. The first and second IDT electrodes 9A and 9B may be different in the number of pairs of electrode fingers, the electrode finger pitch, the intersecting width, or other parameters, which may be selected as appropriate in accordance with the intended filter characteristics.

In the present preferred embodiment, the first IDT electrodes 9A in the elastic wave resonators S1 to S3 each preferably have a duty ratio of about 0.68, for example, and the first IDT electrodes 9A in the longitudinally coupled resonator elastic wave filters D1 and D2 each preferably have a duty ratio of about 0.64, for example. The average of the duty ratios of the plurality of first IDT electrodes 9A of the first band-pass filter 3A is preferably about 0.67, for example. In contrast, each of the second IDT electrodes 9B in the elastic wave resonators S11 to S13 and P11 and the longitudinally coupled resonator elastic wave filter D11 preferably has a duty ratio of about 0.6, for example. The average of the duty ratios of the plurality of second IDT electrodes 9B of the second band-pass filter 3B is preferably about 0.6, for example. These are shown in Table 1 below.

As used herein, the average of duty ratios in the context of comparison between a plurality of elastic wave resonators refers to the weighted average based on the number of electrode fingers of each IDT electrode. For example, the weighted average of the duty ratios of an IDT electrode including X electrode fingers and a duty ratio of Dx, an IDT electrode including Y electrode fingers and a duty ratio of Dy, and an IDT electrode including Z electrode fingers and a duty ratio of Dz is defined by: weighted average of duty ratios=$(X \times Dx + Y \times Dy + Z \times Dz)/(X+Y+Z)$.

TABLE 1

|  |  | Duty Ratio | Weighted Average Of Duty Ratios |
|---|---|---|---|
| First Band-Pass Filter 3A | Elastic Wave Resonator S1 | 0.68 | 0.67 |
|  | Elastic Wave Resonator S2 | 0.68 |  |
|  | Elastic Wave Resonator S3 | 0.68 |  |
|  | Longitudinally Coupled Resonator Elastic Wave Filter D1 | 0.64 |  |
|  | Longitudinally Coupled Resonator Elastic Wave Filter D2 | 0.64 |  |
| Second Band- | Elastic Wave Resonator S11 | 0.6 | 0.6 |

TABLE 1-continued

|  |  | Duty Ratio | Weighted Average Of Duty Ratios |
|---|---|---|---|
| Pass Filter 3B | Elastic Wave Resonator S12 | 0.6 |  |
|  | Elastic Wave Resonator S13 | 0.6 |  |
|  | Elastic Wave Resonator P11 | 0.6 |  |
|  | Longitudinally Coupled Resonator Elastic Wave Filter D11 | 0.6 |  |

In the first and second band-pass filters 3A and 3B, the first and second IDT electrodes 9A and 9B illustrated in FIG. 4 have the same or substantially the same film thickness and are made of the same material. The first and second dielectric films 16A and 16B also have the same or substantially the same film thickness and are made of the same material. In the context of the same or substantially the same film thickness, as used herein, differences such as variations during formation in the same process are included.

In the present preferred embodiment: 1) the first and second communication bands described above have a relationship of $|Tx1-Rx1|/f1 > |Tx2-Rx2|/f2$; 2) the weighted average of the duty ratios of the plurality of first IDT electrodes 9A of the first band-pass filter 3A is larger than the weighted average of the duty ratios of the plurality of second IDT electrodes 9B of the second band-pass filter 3B; and 3) at least one pair among a pair of the first and second IDT electrodes 9A and 9B and a pair of the first and second dielectric films 16A and 16B has the same or substantially the same film thickness and is made of the same material. The features described above facilitate frequency adjustment of the first and second band-pass filters 3A and 3B provided on the same piezoelectric substrate 7.

This will be described below, along with the detailed configuration of the first and second band-pass filters 3A and 3B.

As illustrated in FIG. 3, the elastic wave device 1 includes a first terminal 5, which is connected to the first band-pass filter 3A. The first band-pass filter 3A includes an input end and an output end. In the present preferred embodiment, the input end side of the first band-pass filter 3A corresponds to the antenna terminal 4 side, and the output end side of the first band-pass filter 3A corresponds to the first terminal 5 side. The elastic wave resonators S1 to S3 and the longitudinally coupled resonator elastic wave filters D1 and D2 are disposed in a series arm connecting the input end and the output end to each other. The longitudinally coupled resonator elastic wave filters D1 and D2 are connected in parallel to each other between the elastic wave resonator S1 and the elastic wave resonator S2. The elastic wave resonator S1 is connected between the antenna terminal 4 and the longitudinally coupled resonator elastic wave filters D1 and D2. The elastic wave resonators S2 and S3 are connected in series with each other between the first terminal 5 and the longitudinally coupled resonator elastic wave filters D1 and D2.

The elastic wave device 1 includes a second terminal 6, which is connected to the second band-pass filter 3B. The second band-pass filter 3B includes an input end and an output end. In the present preferred embodiment, the input end side of the second band-pass filter 3B corresponds to the antenna terminal 4 side, and the output end side of the second band-pass filter 3B corresponds to the second terminal 6 side. The elastic wave resonators S11 to S13 and the longitudinally coupled resonator elastic wave filter D11 are disposed in a series arm connecting the input end and the output end to each other. The elastic wave resonators S11 to S13 are connected in series with each other between the antenna terminal 4 and the longitudinally coupled resonator elastic wave filter D11. The elastic wave resonator P11 is connected between the series arm and ground potential. More specifically, the elastic wave resonator P11 is connected between a node between the antenna terminal 4 and the elastic wave resonator S11 and ground potential.

An inductor L that provides impedance adjustment is connected between the antenna terminal 4 and ground potential. In the present preferred embodiment, solder or via-hole electrode connection, wiring connection, or other suitable connection, for example, is provided in a portion of each terminal encircled by a broken line in FIG. 2. These connections enable the first and second band-pass filters 3A and 3B to be electrically connected to the outside.

Preferably, the first band-pass filter 3A has low insertion loss in the first receive band and low out-of-band attenuation in the first transmit band. Similarly, preferably, the second band-pass filter 3B has low insertion loss in the second receive band and low out-of-band attenuation in the second transmit band. To control the filter characteristics described above, frequency adjustment is performed in the process for manufacturing the elastic wave device 1, which will be described in detail below.

Figure 5:
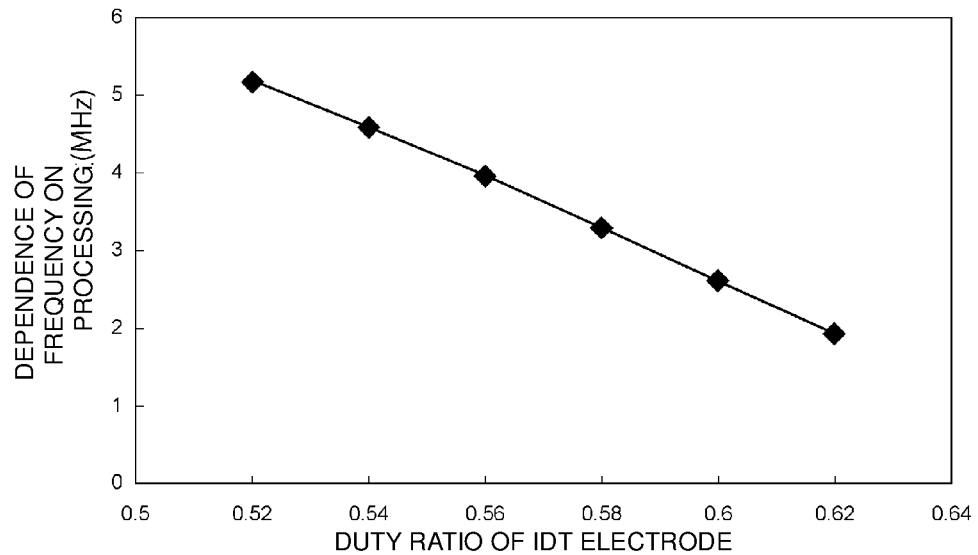
FIG. 5 is a diagram illustrating a relationship between duty ratios of IDT electrodes and dependences of frequencies on processing.

In the present preferred embodiment, the duty ratios of all of the first IDT electrodes in the first band-pass filter 3A are preferably larger than those of all of the second IDT electrodes in the second band-pass filter 3B. This makes the dependences of the frequencies of the first and second band-pass filters 3A and 3B on processing different. FIG. 5 illustrates a relationship between duty ratios of IDT electrodes and dependences of frequencies on processing.

To determine the relationship in FIG. 5, a plurality of band-pass filters having different duty ratios of IDT electrodes were prepared. A plurality of band-pass filters having the same or substantially the same electrode film thickness of IDT electrodes, the same or substantially the same dielectric film thickness, and different electrode finger widths (duty ratios) were also prepared. The plurality of band-pass filters had the same pass band, which was Band 25. The frequency characteristics of each band-pass filter were measured to determine the amount of change in frequency relative to the amount of change in electrode finger width for each duty ratio. Accordingly, the dependence of frequency on processing was determined for each of the duty ratios of IDT electrodes.

FIG. 5 is a diagram illustrating a relationship between duty ratios of IDT electrodes and dependences of frequencies on processing.

As illustrated in FIG. 5, it was discovered that the dependence of frequency on processing decreases as the duty ratio of the IDT electrode increases. In the present preferred embodiment, the duty ratios of all of the first IDT electrodes are preferably larger than the duty ratios of all of the second IDT electrodes. Thus, the dependence of the frequency of the first band-pass filter on processing is less than the dependence of the frequency of the second band-pass filter on processing.

It is preferable that the weighted average of duty ratios of a plurality of first IDT electrodes is larger than the weighted average of duty ratios of a plurality of second IDT electrodes. Also in this case, the dependence of the frequency of the first band-pass filter on processing is able to be made lower than the dependence of the frequency of the second band-pass filter on processing. More preferably, as in the present preferred embodiment, the duty ratios of all of the first IDT electrodes are larger than the duty ratios of all of the second IDT electrodes.

As described above, in the present preferred embodiment, the relationship of $|Tx1-Rx1|/f1>|Tx2-Rx2|/f2$ is satisfied. The frequency spacing between the second transmit band and the second receive band is narrower than the frequency spacing between the first transmit band and the first receive band. Thus, the second band-pass filter 3B illustrated in FIG. 3 needs to be subjected to frequency adjustment with high accuracy to achieve both a reduction in insertion loss in the second receive band and an increase in out-of-band attenuation in the second transmit band. In contrast, the first band-pass filter 3A is able to more easily achieve both a reduction in insertion loss in the first receive band and an increase in out-of-band attenuation in the first transmit band than the second band-pass filter 3B.

The dependence of frequency on processing for the first band-pass filter 3A is less than that for the second band-pass filter 3B. Thus, even if frequency adjustment is performed on the first band-pass filter 3A under conditions for the frequency adjustment of the second band-pass filter 3B, both the reduction in insertion loss and the increase in out-of-band attenuation are able to be easily achieved.

In a non-limiting example of a process for manufacturing the elastic wave device 1, frequency adjustment is performed simultaneously on the first and second band-pass filters 3A and 3B under conditions for the frequency adjustment of the second band-pass filter 3B, for example. This is able to sufficiently decrease insertion loss in the second band-pass filter 3B and sufficiently increase the out-of-band attenuation corresponding to the pass band of the fourth band-pass filter 3D. Additionally, the insertion loss is also sufficiently low in the first band-pass filter 3A after the frequency adjustment, and the out-of-band attenuation is sufficiently large corresponding to the pass band of the third band-pass filter 3C. In the present preferred embodiment, accordingly, frequency adjustment is able to be easily performed on the first and second band-pass filters 3A and 3B on the same piezoelectric substrate 7.

The following describes the benefits and advantages of the present preferred embodiment in further detail, along with an exemplary method for manufacturing the elastic wave device 1.

Figure 6A:
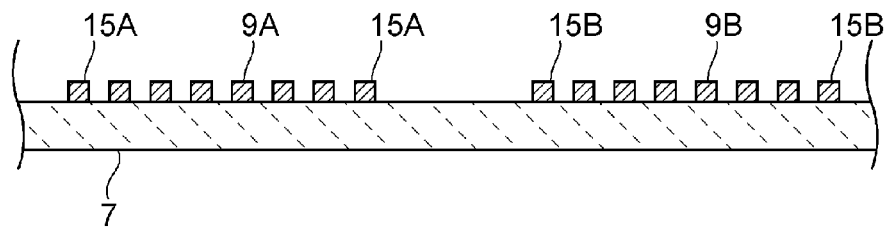
FIGS. 6A and 6B are schematic sectional views describing a method for manufacturing the elastic wave device according to the first preferred embodiment of the present invention.
Figure 6B:
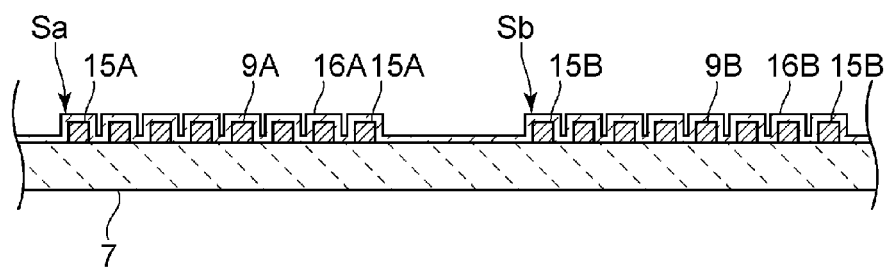
Figure 7:
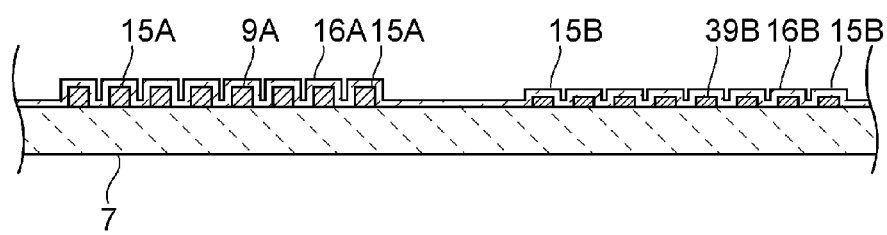
FIG. 7 is a schematic sectional view of an elastic wave device according to a first modification of the first preferred embodiment of the present invention.

FIGS. 6A and 6B are schematic sectional views describing a method for manufacturing the elastic wave device according to the first preferred embodiment. While the electrode finger pitches and the duty ratios are actually different due to the implementation of filters having different frequencies, the electrode finger pitch and the duty ratio are the same or substantially the same in this schematic diagram, for the purpose of simplification.

As illustrated in FIG. 6A, the piezoelectric substrate 7 is prepared. Then, a first IDT electrode forming step and a second IDT electrode forming step are performed. More specifically, the first and second IDT electrodes 9A and 9B are simultaneously formed on the piezoelectric substrate 7. The reflectors 15A and 15B are also formed simultaneously with the first and second IDT electrodes 9A and 9B. The first and second IDT electrodes 9A and 9B may be formed by using, for example, a deposition method, such as a sputtering method or a vapor deposition method. In this manner, the first IDT electrode forming step and the second IDT electrode forming step are simultaneously performed using the same material. Thus, the first and second IDT electrodes 9A and 9B are made of the same material and have the same or substantially the same film thickness.

At this time, all of the first and second IDT electrodes 9A and 9B of the first and second band-pass filters have been formed. Since the first and second IDT electrodes 9A and 9B are simultaneously formed, the deviations of the electrode finger widths from a desired value are the same or substantially the same.

Then, frequency adjustment is performed on the first and second band-pass filters. To achieve frequency adjustment, for example, etching is performed so that the second IDT electrode 9B has a predetermined electrode finger width. At this time, frequency adjustment is simultaneously performed on the first and second band-pass filters under the conditions for the frequency adjustment of the second band-pass filter. Thus, as the electrode finger width of the second IDT electrode 9B changes, the electrode finger width of the first IDT electrode 9A also changes at the same time. Even in this case, satisfactory filter characteristics are able to be obtained since the dependence of the frequency of the first band-pass filter on processing is low. In the present preferred embodiment, additionally, the deviations of the electrode finger widths of the first and second IDT electrodes 9A and 9B from the desired value are the same or substantially the same. This facilitates the control of the filter characteristics of the first band-pass filter as well as the second band-pass filter for simultaneous frequency adjustment of the first and second band-pass filters under the conditions described above. Accordingly, the frequency adjustment of the first and second band-pass filters is able to be easily performed.

Then, as illustrated in FIG. 6B, the first and second dielectric films 16A and 16B are formed on the piezoelectric substrate 7 using the same material so as to cover the first and second IDT electrodes 9A and 9B and the reflectors 15A and 15B. In this manner, the first dielectric film forming step and the second dielectric film forming step are simultaneously performed. This enables the formation of the first and second dielectric films 16A and 16B, which are made of the same material and have the same or substantially the same film thickness. The first and second dielectric film forming steps may be performed by using, for example, a deposition method such as a sputtering method. This enables the first and second dielectric films 16A and 16B to have the same or substantially the same effect on the frequencies of the first and second band-pass filters. Thus, the filter characteristics are able to be easily controlled.

The third and fourth band-pass filters may be constructed on a piezoelectric substrate different from the piezoelectric substrate that includes the first and second band-pass filters. The third and fourth band-pass filters may be constructed by, for example, forming a plurality of IDT electrodes and reflectors on the piezoelectric substrate.

As described above, it is preferable that at least one pair among a pair of the first and second IDT electrodes 9A and 9B and a pair of the first and second dielectric films 16A and 16B have the same or substantially the same film thickness and are made of the same material. For example, as in a first modification of the first preferred embodiment illustrated in FIG. 7, first and second IDT electrodes 9A and 39B may have different film thicknesses and be made of different materials. First and second dielectric films 16A and 16B have the same or substantially the same film thickness and are made of the same material. In the first modification, the first and second IDT electrodes 9A and 39B are formed in different steps, and the first and second dielectric films 16A and 16B are simultaneously formed.

Figure 8:
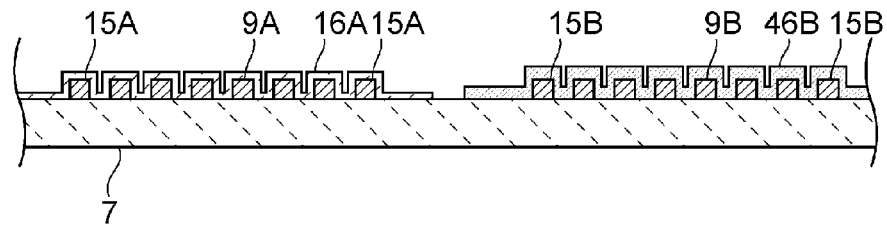
FIG. 8 is a schematic sectional view of an elastic wave device according to a second modification of the first preferred embodiment of the present invention.

Alternatively, as in a second modification of the first preferred embodiment illustrated in FIG. 8, first and second dielectric films 16A and 46B may have different film thicknesses and be made of different materials. First and second IDT electrodes 9A and 9B have the same or substantially the same film thickness and are made of the same material. In the second modification, the first and second IDT electrodes 9A and 9B are simultaneously formed, and the first and second dielectric films 16A and 46B are formed in different steps.

It is more preferable that, as in the present preferred embodiment illustrated in FIG. 4, the first and second IDT electrodes 9A and 9B have the same or substantially the same film thickness and are made of the same material and that the first and second dielectric films 16A and 16B have the same or substantially the same film thickness and are made of the same material. That is, it is more preferable that, as illustrated in FIGS. 6A and 6B, the first and second IDT electrode forming steps are simultaneously performed and that the first and second dielectric film forming steps are simultaneously performed. This further improves productivity and more easily controls the filter characteristics.

Figure 9:
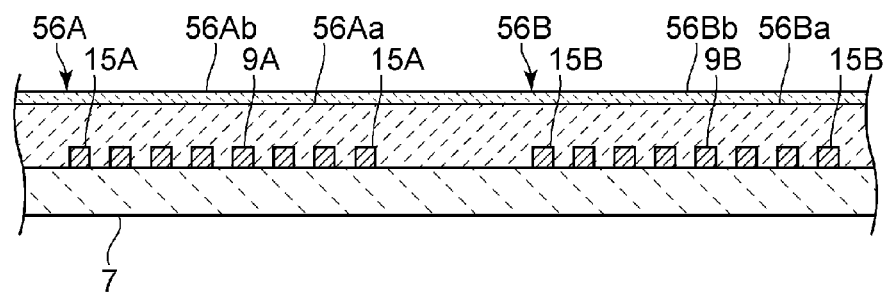
FIG. 9 is a schematic sectional view of an elastic wave device according to a third modification of the first preferred embodiment of the present invention.

As in a third modification of the first preferred embodiment illustrated in FIG. 9, first and second dielectric films 56A and 56B may preferably include first layers 56Aa and 56Ba, which embed first and second IDT electrodes 9A and 9B. The first and second dielectric films 56A and 56B may preferably include, in addition to the first layers 56Aa and 56Ba, second layers 56Ab and 56Bb that are disposed on top of the first layers 56Aa and 56Ba. The first layers 56Aa and 56Ba are preferably made of, for example, $SiO_2$. The second layers 56Ab and 56Bb are preferably made of, for example, SiN. Accordingly, the first and second dielectric films are not limited to any specific structure and may have a multi-layer film structure. The first and second IDT electrodes may also have a multi-layer film structure.

Figure 10:
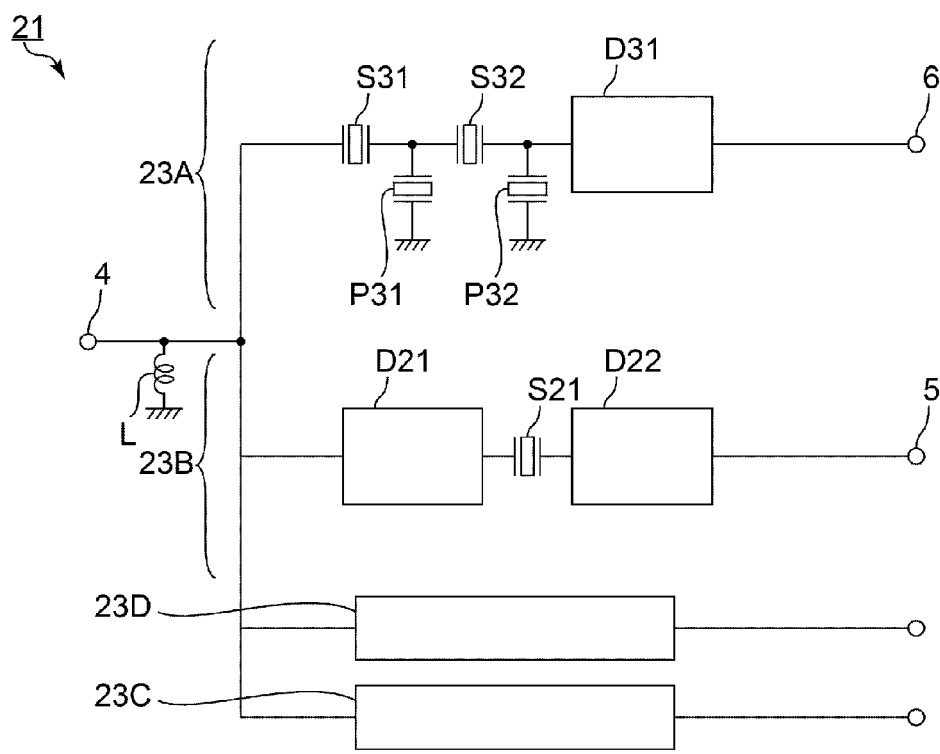
FIG. 10 is a schematic circuit diagram of an elastic wave device according to a second preferred embodiment of the present invention.

FIG. 10 is a schematic circuit diagram of an elastic wave device according to a second preferred embodiment of the present invention.

An elastic wave device 21 is different from that of the first preferred embodiment in the first and second communication bands, the circuit configuration of first to fourth band-pass filters 23A to 23D, and the duty ratio of the first and second IDT electrodes. The remaining configuration of the elastic wave device 21 is the same as or similar to that of the elastic wave device 1 of the first preferred embodiment.

In the present preferred embodiment, the first receive band is preferably the receive band of Band 20, for example, which is greater than or equal to about 791 MHz and less than or equal to about 821 MHz. The first transmit band is preferably the transmit band of Band 20, for example, which is greater than or equal to about 832 MHz and less than or equal to about 862 MHz. The second receive band is preferably the receive band of Band 8, for example, which is greater than or equal to about 925 MHz and less than or equal to about 960 MHz. The second transmit band is preferably the transmit band of Band 8, for example, which is greater than or equal to about 880 MHz and is less than or equal to about 915 MHz.

In the elastic wave device 21, $|Tx1-Rx1|/f1$=about 1.36% is preferably satisfied and $|Tx2-Rx2|/f2$=about 1.06% is preferably satisfied, for example. As in the first preferred embodiment, therefore, $|Tx1-Rx1|/f1>|Tx2-Rx2|/f2$ is preferably satisfied, for example.

The second band-pass filter 23B includes an elastic wave resonator S21 and longitudinally coupled resonator elastic wave filters D21 and D22, which are disposed in a series arm. The elastic wave resonator S21 is connected between the longitudinally coupled resonator elastic wave filter D21 and the longitudinally coupled resonator elastic wave filter D22.

The first band-pass filter 23A includes elastic wave resonators S31 and S32 and a longitudinally coupled resonator elastic wave filter D31, which are disposed in a series arm. The elastic wave resonators S31 and S32 are connected in series with each other between the antenna terminal 4 and the longitudinally coupled resonator elastic wave filter D31. An elastic wave resonator P31 is connected between a node between the elastic wave resonator S31 and the elastic wave resonator S32 and a ground potential. An elastic wave resonator P32 is connected between a node between the elastic wave resonator S32 and the longitudinally coupled resonator elastic wave filter D31 and a ground potential.

The elastic wave resonator S21 is a series trap in the second band-pass filter 23B. The elastic wave resonators S31 and S32 are series traps in the first band-pass filter 23A. The elastic wave resonators P31 and P32 are parallel traps in the first band-pass filter 23A.

For example, the second IDT electrode of the elastic wave resonator S21 preferably has a duty ratio of about 0.50, and the second IDT electrode of each of the longitudinally coupled resonator elastic wave filters D21 and D22 preferably has a duty ratio of about 0.55. The weighted average of the duty ratios of the second band-pass filter 23B is preferably about 0.53, for example. In contrast, for example, the first IDT electrode of each of the elastic wave resonators S31, S32, P31, and P32 preferably has a duty ratio of about 0.52, and the first IDT electrode of the longitudinally coupled resonator elastic wave filter D31 preferably has a duty ratio of about 0.57. The weighted average of the duty ratios of the first band-pass filter 23A is preferably about 0.54, for example. These are shown in Table 2 below.

TABLE 2

|  |  | Duty Ratio | Weighted Average Of Duty Ratios |
|---|---|---|---|
| First Band-Pass Filter 23A | Elastic Wave Resonator S31 | 0.52 | 0.54 |
|  | Elastic Wave Resonator S32 | 0.52 |  |
|  | Elastic Wave Resonator P31 | 0.52 |  |
|  | Elastic Wave Resonator P32 | 0.52 |  |
|  | Longitudinally Coupled Resonator Elastic Wave Filter D31 | 0.57 |  |
| Second Band-Pass Filter 23B | Elastic Wave Resonator S21 | 0.50 | 0.53 |
|  | Longitudinally Coupled Resonator Elastic Wave Filter D21 | 0.55 |  |
|  | Longitudinally Coupled Resonator Elastic Wave Filter D22 | 0.55 |  |

In the present preferred embodiment, the weighted average of the duty ratios of the first IDT electrodes is larger than the weighted average of the duty ratios of the second IDT electrodes. Thus, the present preferred embodiment is also able to facilitate the frequency adjustment of the first and second band-pass filters 23A and 23B.

Figure 11:
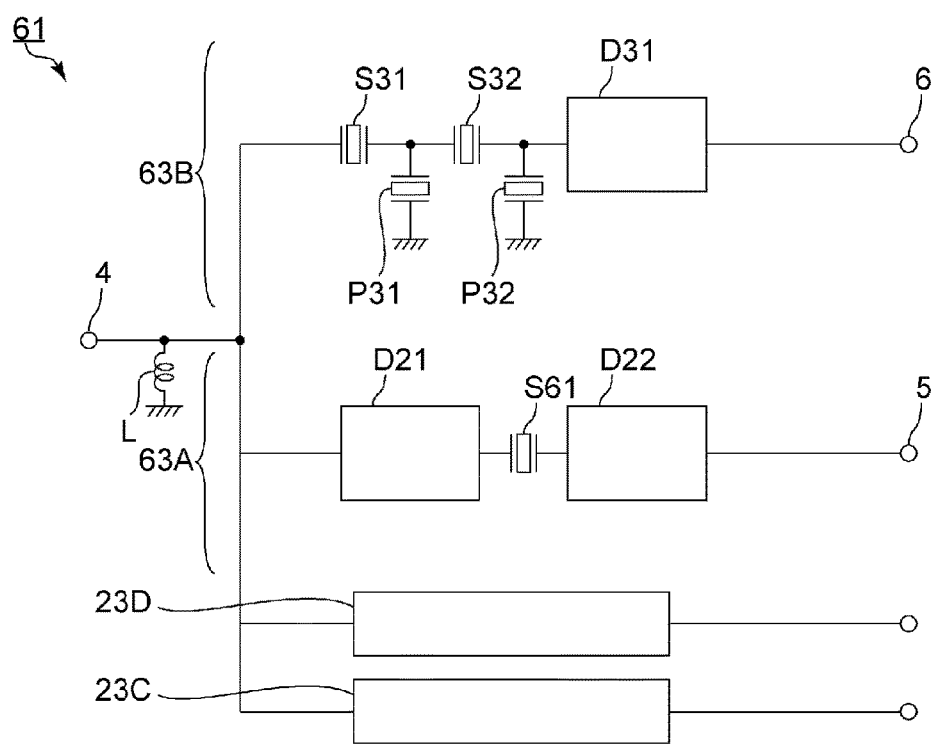
FIG. 11 is a schematic circuit diagram of an elastic wave device according to a modification of the second preferred embodiment of the present invention.

FIG. 11 is a schematic circuit diagram of an elastic wave device according to a modification of the second preferred embodiment.

In the present modification, a first band-pass filter 63A has the circuit configuration of the second band-pass filter 23B according to the second preferred embodiment illustrated in FIG. 10. In contrast, a second band-pass filter 63B has the circuit configuration of the first band-pass filter 23A according to the second preferred embodiment. In addition, in an elastic wave device 61 according to the present modification, the duty ratio of an elastic wave resonator S61, which is a series trap in the first band-pass filter 63A, is different from that in the second preferred embodiment. The remaining configuration of the elastic wave device 61 is the same as or similar to that of the elastic wave device 21 of the second preferred embodiment.

More specifically, the duty ratio of the elastic wave resonator S61 is larger than the duty ratio of each of the elastic wave resonators P31 and P32, which are parallel traps in the second band-pass filter 63B.

In preferred embodiments of the present invention, a first elastic wave resonator(s) is at least one elastic wave resonator among elastic wave resonators disposed in a series arm in a first band-pass filter. A second elastic wave resonator(s) is at least one elastic wave resonator among elastic wave resonators disposed in a series arm in a second band-pass filter. A third elastic wave resonator(s) is at least one elastic wave resonator among elastic wave resonators connected between the series arm in the first band-pass filter and a ground potential. A fourth elastic wave resonator(s) is at least one elastic wave resonator among elastic wave resonators connected between the series arm in the second band-pass filter and the ground potential. The elastic wave resonator S61 is the first elastic wave resonator, and the elastic wave resonators P31 and P32 are the fourth elastic wave resonators.

In the characteristics of the low-frequency side of the pass band of a band-pass filter, the impedance characteristics of a parallel trap tend to have a large contribution. In the characteristics of the high-frequency side of the pass band, the impedance characteristics of a series trap tend to have a large contribution. In the elastic wave device 61, the second transmit band is located on the low-frequency side of the second receive band. In the second band-pass filter 63B, therefore, the impedance characteristics of the elastic wave resonators P31 and P32, which are parallel traps, largely contribute to the out-of-band attenuation for the second transmit band. The frequency spacing between the second transmit band and the second receive band is narrower than the frequency spacing between the first transmit band and the first receive band. It is thus preferable to perform frequency adjustment on, in particular, the elastic wave resonators P31 and P32 with high accuracy.

In contrast, the first transmit band is located on the high-frequency side of the first receive band. Thus, the characteristics of the elastic wave resonator S61, which is a series trap, largely contribute to the out-of-band attenuation for the first transmit band. Additionally, since the relationship of |Tx1−Rx1|/f1>|Tx2−Rx2|/f2 is satisfied, satisfactory filter characteristics of the elastic wave resonator S61 are able to be obtained more easily than the filter characteristics of the elastic wave resonators P31 and P32.

In the present modification, the duty ratios of all of the first elastic wave resonators, namely, the elastic wave resonator S61, are preferably larger than the duty ratios of all of the fourth elastic wave resonators, namely, the elastic wave resonators P31 and P32. Thus, as in the manufacturing process according to the first preferred embodiment, frequency adjustment is able to be simultaneously performed on the first and second band-pass filters 63A and 63B. This facilitates the frequency adjustment of the first and second band-pass filters 63A and 63B.

In a preferred embodiment of the present invention, it is preferable that the weighted average of duty ratios of first elastic wave resonators is larger than the weighted average of duty ratios of fourth elastic wave resonators. Also in this case, frequency adjustment is able to be easily performed on the first and second band-pass filters 63A and 63B. It is more preferable that, as in the elastic wave device 61, the duty ratios of all of the first elastic wave resonators are larger than the duty ratios of all of the fourth elastic wave resonators.

In a non-limiting example of a manufacturing of the elastic wave device 61, steps other than the second IDT electrode forming step in the method for manufacturing the elastic wave device 1 described above may be performed in a manner the same as or similar to those in the method for manufacturing the elastic wave device 1. More specifically, it is preferable to, in the second IDT electrode forming step, form the second IDT electrodes of the elastic wave resonators P31 and P32, for which the weighted average of the duty ratios is smaller than the duty ratio of the first IDT electrode of the elastic wave resonator S61. When an elastic wave device includes a plurality of first elastic wave resonators and a plurality of fourth elastic wave resonators, it is preferable to form second IDT electrodes of the fourth elastic wave resonators, for which the weighted average of the duty ratios is smaller than the weighted average of the duty ratios of the first IDT electrodes of the first elastic wave resonators.

On the other hand, a preferred example is provided in which the pass band of a third band-pass filter is located in a higher frequency range than the frequency range of the pass band of a first band-pass filter and the pass band of a fourth band-pass filter is located in a higher frequency range than the frequency range of the pass band of a second band-pass filter. As described above, first elastic wave resonators are series traps in the first band-pass filter, and second elastic wave resonators are series traps in the second band-pass filter. In this case, preferably, the weighted average of the duty ratios of the first elastic wave resonators, which are series traps in the first band-pass filter, is larger than the weighted average of the duty ratios of the second elastic wave resonators, which are series traps in the second band-pass filter. More preferably, the duty ratios of all of the first elastic wave resonators are larger than the duty ratios of all of the second elastic wave resonators.

In the non-limiting example of the manufacturing of the elastic wave device described above, steps other than the second IDT electrode forming step in the method for manufacturing the elastic wave device 1 described above may be performed in a manner the same as or similar to those in the method for manufacturing the elastic wave device 1. More specifically, it is preferable to, in the second IDT electrode forming step, form the second IDT electrodes of the second elastic wave resonators, for which the weighted average of the duty ratios is smaller than the weighted average of the duty ratios of the first IDT electrodes of the first elastic wave resonators.

A preferred example is provided in which the pass band of a third band-pass filter is located in a lower frequency range than the frequency range of the pass band of a first band-pass filter and the pass band of a fourth band-pass filter is located in a lower frequency range than the frequency range of the pass band of a second band-pass filter. As described above, third elastic wave resonators are parallel traps in the first band-pass filter, and fourth elastic wave resonators are parallel traps in the second band-pass filter. In this case, preferably, the weighted average of the duty ratios of the third elastic wave resonators, which are parallel traps in the first band-pass filter, is larger than the weighted average of the duty ratios of the fourth elastic wave resonators, which are parallel traps in the second band-pass filter. More preferably, the duty ratios of all of the third elastic wave resonators are larger than the duty ratios of all of the fourth elastic wave resonators.

In the non-limiting example of the manufacturing of the elastic wave device described above, steps other than the second IDT electrode forming step in the method for manufacturing the elastic wave device 1 described above can be performed in a manner the same as or similar to those in the method for manufacturing the elastic wave device 1. More specifically, it is preferable to, in the second IDT electrode forming step, form the second IDT electrodes of the fourth elastic wave resonators, for which the weighted average of the duty ratios is smaller than the weighted average of the duty ratios of the first IDT electrodes of the third elastic wave resonators.

A preferred example is provided in which the pass band of a third band-pass filter is located in a lower frequency range than the frequency range of the pass band of a first band-pass filter and the pass band of a fourth band-pass filter is located in a higher frequency range than the frequency range of the pass band of a second band-pass filter. In this case, preferably, the weighted average of the duty ratios of third elastic wave resonators, which are parallel traps in the first band-pass filter, is larger than the weighted average of the duty ratios of second elastic wave resonators, which are series traps in the second band-pass filter. More preferably, the duty ratios of all of the third elastic wave resonators are larger than the duty ratios of all of the second elastic wave resonators.

In the non-limiting example of the manufacturing of the elastic wave device described above, steps other than the second IDT electrode forming step in the method for manufacturing the elastic wave device 1 described above can be performed in a manner the same as or similar to those in the method for manufacturing the elastic wave device 1. More specifically, it is preferable to, in the second IDT electrode forming step, form the second IDT electrodes of the second elastic wave resonators, for which the weighted average of the duty ratios is smaller than the weighted average of the duty ratios of the first IDT electrodes of the third elastic wave resonators.

The first and second preferred embodiments and the modifications thereof provide examples in which the first and second band-pass filters are receive filters. The first and second band-pass filters may be transmit filters. Alternatively, one of the first and second band-pass filters may be a receive filter, and the other may be a transmit filter. Elastic wave devices according to preferred embodiments of the present invention may not necessarily include a third or fourth band-pass filter. Also in this case, preferred embodiments of the present invention may be favorably applied to, for example, an elastic wave device that is mounted on a mounting substrate and that is connected to elements corresponding to third and fourth band-pass filters.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate;
   a first band-pass filter including a plurality of first IDT electrodes disposed on the piezoelectric substrate, and a first dielectric film disposed on the piezoelectric substrate so as to cover the plurality of first IDT electrodes, the first band-pass filter including a pass band within a first communication band including a first transmit band and a first receive band, the pass band of the first band-pass filter corresponding to the first transmit band or the first receive band; and a second band-pass filter including a plurality of second IDT electrodes disposed on the piezoelectric substrate, and a second dielectric film disposed on the piezoelectric substrate so as to cover the plurality of second IDT electrodes, the second band-pass filter including a pass band within a second communication band different from the first communication band and including a second transmit band and a second receive band, the pass band of the second band-pass filter corresponding to the second transmit band or the second receive band; wherein at least one pair among a pair of the first and second IDT electrodes and a pair of the first and second dielectric films has the same or substantially the same film thickness and is made of the same material;

|Tx1−Rx1|/f1>|Tx2−Rx2|/f2 is satisfied wherein a frequency at an end of the first transmit band in the first communication band closest to the first receive band is represented by Tx1, a frequency at an end of the first receive band in the first communication band closest to the first transmit band is represented by Rx1, a center frequency of the pass band of the first band-pass filter is represented by f1, a frequency at an end of the second transmit band in the second communication band closest to the second receive band is represented by Tx2, a frequency at an end of the second receive band in the second communication band closest to the second transmit band is represented by Rx2, and a center frequency of the pass band of the second band-pass filter is represented by f2; and a weighted average of duty ratios of the plurality of first IDT electrodes is larger than a weighted average of duty ratios of the plurality of second IDT electrodes.

2. A method for manufacturing the elastic wave device according to claim 1, comprising:

a step of preparing the piezoelectric substrate;

a first IDT electrode forming step of forming the plurality of first IDT electrodes on the piezoelectric substrate;

a second IDT electrode forming step of forming the plurality of second IDT electrodes on the piezoelectric substrate;

a first dielectric film forming step of stacking the first dielectric film on the piezoelectric substrate so as to cover the plurality of first IDT electrodes; and a second dielectric film forming step of stacking the second dielectric film on the piezoelectric substrate so as to cover the plurality of second IDT electrodes; wherein in the second IDT electrode forming step, the plurality of second IDT electrodes are formed such that the weighted average of the duty ratios is smaller than the weighted average of the duty ratios of the plurality of first IDT electrodes;

at least one pair among a pair of the first and second IDT electrode forming steps and a pair of the first and second dielectric film forming steps is simultaneously performed using the same material; and the method further comprises a step of simultaneously performing frequency adjustment on the first and second band-pass filters.

3. The method for manufacturing the elastic wave device according to claim 2, wherein the first IDT electrode forming step and the second IDT electrode forming step are simultaneously performed, and the first dielectric film forming step and the second dielectric film forming step are simultaneously performed.

4. The method for manufacturing the elastic wave device according to claim 2, wherein steps that are simultaneously performed among the first and second IDT electrode forming steps and the first and second dielectric film forming steps are performed by using a deposition method.

5. The elastic wave device according to claim 1, wherein the duty ratios of all of the first IDT electrodes are larger than the duty ratios of all of the second IDT electrodes.

6. The elastic wave device according to claim 1, wherein the first and second band-pass filters are receive filters.

7. The elastic wave device according to claim 1, wherein the first and second band-pass filters are transmit filters.

8. The elastic wave device according to claim 1, wherein the first and second IDT electrodes have the same or substantially the same film thickness and are made of the same material, and the first and second dielectric films have the same or substantially the same film thickness and are made of the same material.

9. The elastic wave device according to claim 1, wherein at least one pair among the pair of the first and second IDT electrodes and the pair of the first and second dielectric films has a multi-layer film structure.

10. An elastic wave device comprising:

a piezoelectric substrate;

a first band-pass filter including a plurality of first IDT electrodes disposed on the piezoelectric substrate, and a first dielectric film disposed on the piezoelectric substrate so as to cover the plurality of first IDT electrodes, the first band-pass filter including a pass band within a first communication band including a first transmit band and a first receive band, the pass band of the first band-pass filter corresponding to the first transmit band or the first receive band; and a second band-pass filter including a plurality of second IDT electrodes disposed on the piezoelectric substrate, and a second dielectric film disposed on the piezoelectric substrate so as to cover the plurality of second IDT electrodes, the second band-pass filter including a pass band within a second communication band different from the first communication band and including a second transmit band and a second receive band, the pass band of the second band-pass filter corresponding to the second transmit band or the second receive band; wherein at least one pair among a pair of the first and second IDT electrodes and a pair of the first and second dielectric films has the same or substantially the same film thickness and is made of the same material;

|Tx1−Rx1|/f1>|Tx2−Rx2|/f2 wherein a frequency at an end of the first transmit band in the first communication band closest to the first receive band is represented by Tx1, a frequency at an end of the first receive band in the first communication band closest to the first transmit band is represented by Rx1, a center frequency of the pass band of the first band-pass filter is represented by f1, a frequency at an end of the second transmit band in the second communication band closest to the second receive band is represented by Tx2, a frequency at an end of the second receive band in the second communication band closest to the second transmit band is represented by Rx2, and a center frequency of the pass band of the second band-pass filter is represented by f2;

another pass band within the first communication band, among the first transmit band and the first receive band, is located in a higher frequency range than a frequency range of the pass band of the first band-pass filter;

another pass band within the second communication band, among the second transmit band and the second receive band, is located in a higher frequency range than a frequency range of the pass band of the second band-pass filter;

the first band-pass filter includes an input end and an output end, and includes one or more first elastic wave resonators that include at least one of elastic wave resonators disposed in a series arm connecting the input end and the output end of the first band-pass filter to each other;

the second band-pass filter includes an input end and an output end, and includes one or more second elastic wave resonators that include at least one of elastic wave resonators disposed in a series arm connecting the input end and the output end of the second band-pass filter to each other; and a weighted average of duty ratios of the first IDT electrodes included in the one or more first elastic wave resonators is larger than a weighted average of duty ratios of the second IDT electrodes included in the one or more second elastic wave resonators.

11. The elastic wave device according to claim 10, wherein the duty ratios of the first IDT electrodes included in all of the one or more first elastic wave resonators are larger than the duty ratios of the second IDT electrodes included in all of the one or more second elastic wave resonators.

12. A method for manufacturing the elastic wave device according to claim 10, comprising:
a step of preparing the piezoelectric substrate;
a first IDT electrode forming step of forming the plurality of first IDT electrodes on the piezoelectric substrate;
a second IDT electrode forming step of forming the plurality of second IDT electrodes on the piezoelectric substrate;
a first dielectric film forming step of stacking the first dielectric film on the piezoelectric substrate so as to cover the plurality of first IDT electrodes; and
a second dielectric film forming step of stacking the second dielectric film on the piezoelectric substrate so as to cover the plurality of second IDT electrodes; wherein
in the second IDT electrode forming step, the second IDT electrodes included in the one or more second elastic wave resonators are formed such that the weighted average of the duty ratios is smaller than the weighted average of the duty ratios of the first IDT electrodes included in the one or more first elastic wave resonators;
at least one pair among a pair of the first and second IDT electrode forming steps and a pair of the first and second dielectric film forming steps is simultaneously performed using the same material; and
the method further comprises a step of simultaneously performing frequency adjustment on the first and second band-pass filters.

13. An elastic wave device comprising:
a piezoelectric substrate;
a first band-pass filter including a plurality of first IDT electrodes disposed on the piezoelectric substrate, and a first dielectric film disposed on the piezoelectric substrate so as to cover the plurality of first IDT electrodes, the first band-pass filter including a pass band within a first communication band including a first transmit band and a first receive band, the pass band of the first band-pass filter corresponding to the first transmit band or the first receive band; and
a second band-pass filter including a plurality of second IDT electrodes disposed on the piezoelectric substrate, and a second dielectric film disposed on the piezoelectric substrate so as to cover the plurality of second IDT electrodes, the second band-pass filter including a pass band within a second communication band different from the first communication band and including a second transmit band and a second receive band, the pass band of the second band-pass filter corresponding to the second transmit band or the second receive band; wherein
at least one pair among a pair of the first and second IDT electrodes and a pair of the first and second dielectric films has the same or substantially the same film thickness and is made of the same material;
$|Tx1-Rx1|/f1 > |Tx2-Rx2|/f2$ wherein a frequency at an end of the first transmit band in the first communication band closest to the first receive band is represented by Tx1, a frequency at an end of the first receive band in the first communication band closest to the first transmit band is represented by Rx1, a center frequency of the pass band of the first band-pass filter is represented by f1, a frequency at an end of the second transmit band in the second communication band closest to the second receive band is represented by Tx2, a frequency at an end of the second receive band in the second communication band closest to the second transmit band is represented by Rx2, and a center frequency of the pass band of the second band-pass filter is represented by f2;
another pass band within the first communication band, among the first transmit band and the first receive band, is located in a lower frequency range than a frequency range of the pass band of the first band-pass filter;
another pass band within the second communication band, among the second transmit band and the second receive band, is located in a lower frequency range than a frequency range of the pass band of the second band-pass filter;
the first band-pass filter includes an input end and an output end, and includes one or more third elastic wave resonators that include at least one of elastic wave resonators connected between a series arm connecting the input end and the output end of the first band-pass filter to each other and a ground potential;
the second band-pass filter includes an input end and an output end, and includes one or more fourth elastic wave resonators that include at least one of elastic wave resonators connected between a series arm connecting the input end and the output end of the second band-pass filter to each other and the ground potential; and
a weighted average of duty ratios of the first IDT electrodes included in the one or more third elastic wave resonators is larger than a weighted average of duty ratios of the second IDT electrodes included in the one or more fourth elastic wave resonators.

14. The elastic wave device according to claim 13, wherein the duty ratios of the first IDT electrodes included in all of the one or more third elastic wave resonators are larger than the duty ratios of the second IDT electrodes included in all of the one or more fourth elastic wave resonators.

15. A method for manufacturing the elastic wave device according to claim 13, comprising:
a step of preparing the piezoelectric substrate;
a first IDT electrode forming step of forming the plurality of first IDT electrodes on the piezoelectric substrate;
a second IDT electrode forming step of forming the plurality of second IDT electrodes on the piezoelectric substrate;
a first dielectric film forming step of stacking the first dielectric film on the piezoelectric substrate so as to cover the plurality of first IDT electrodes; and
a second dielectric film forming step of stacking the second dielectric film on the piezoelectric substrate so as to cover the plurality of second IDT electrodes; wherein
in the second IDT electrode forming step, the second IDT electrodes included in the one or more fourth elastic wave resonators are formed such that the weighted average of the duty ratios is smaller than the weighted average of the duty ratios of the first IDT electrodes included in the one or more third elastic wave resonators;
at least one pair among a pair of the first and second IDT electrode forming steps and a pair of the first and second dielectric film forming steps is simultaneously performed using the same material; and
the method further comprises a step of simultaneously performing frequency adjustment on the first and second band-pass filters.

16. An elastic wave device comprising:
a piezoelectric substrate;
a first band-pass filter including a plurality of first IDT electrodes disposed on the piezoelectric substrate, and a first dielectric film disposed on the piezoelectric substrate so as to cover the plurality of first IDT electrodes, the first band-pass filter including a pass band within a first communication band including a first transmit band and a first receive band, the pass band of the first band-pass filter corresponding to the first transmit band or the first receive band; and
a second band-pass filter including a plurality of second IDT electrodes disposed on the piezoelectric substrate, and a second dielectric film disposed on the piezoelectric substrate so as to cover the plurality of second IDT electrodes, the second band-pass filter including a pass band within a second communication band different from the first communication band and including a second transmit band and a second receive band, the pass band of the second band-pass filter corresponding to the second transmit band or the second receive band; wherein
at least one pair among a pair of the first and second IDT electrodes and a pair of the first and second dielectric films has the same or substantially the same film thickness and is made of the same material;
$|Tx1-Rx1|/f1 > |Tx2-Rx2|/f2$ wherein a frequency at an end of the first transmit band in the first communication band closest to the first receive band is represented by Tx1, a frequency at an end of the first receive band in the first communication band closest to the first transmit band is represented by Rx1, a center frequency of the pass band of the first band-pass filter is represented by f1, a frequency at an end of the second transmit band in the second communication band closest to the second receive band is represented by Tx2, a frequency at an end of the second receive band in the second communication band closest to the second transmit band is represented by Rx2, and a center frequency of the pass band of the second band-pass filter is represented by f2;
another pass band within the first communication band, among the first transmit band and the first receive band, is located in a higher frequency range than a frequency range of the pass band of the first band-pass filter;
another pass band within the second communication band, among the second transmit band and the second receive band, is located in a lower frequency range than a frequency range of the pass band of the second band-pass filter;
the first band-pass filter includes an input end and an output end, and includes one or more first elastic wave resonators that include at least one of elastic wave resonators disposed in a series arm connecting the input end and the output end of the first band-pass filter to each other;
the second band-pass filter includes an input end and an output end, and includes one or more fourth elastic wave resonators that include at least one of elastic wave resonators connected between a series arm connecting the input end and the output end of the second band-pass filter to each other and a ground potential; and
a weighted average of duty ratios of the first IDT electrodes included in the one or more first elastic wave resonators is larger than a weighted average of duty ratios of the second IDT electrodes included in the one or more fourth elastic wave resonators.

17. The elastic wave device according to claim 16, wherein the duty ratios of the first IDT electrodes included in all of the one or more first elastic wave resonators are larger than the duty ratios of the second IDT electrodes included in all of the one or more fourth elastic wave resonators.

18. A method for manufacturing the elastic wave device according to claim 16, comprising:
a step of preparing the piezoelectric substrate;
a first IDT electrode forming step of forming the plurality of first IDT electrodes on the piezoelectric substrate;
a second IDT electrode forming step of forming the plurality of second IDT electrodes on the piezoelectric substrate;
a first dielectric film forming step of stacking the first dielectric film on the piezoelectric substrate so as to cover the plurality of first IDT electrodes; and
a second dielectric film forming step of stacking the second dielectric film on the piezoelectric substrate so as to cover the plurality of second IDT electrodes; wherein
in the second IDT electrode forming step, the second IDT electrodes included in the one or more fourth elastic wave resonators are formed such that the weighted average of the duty ratios is smaller than the weighted average of the duty ratios of the first IDT electrodes included in the one or more first elastic wave resonators;
at least one pair among a pair of the first and second IDT electrode forming steps and a pair of the first and second dielectric film forming steps is simultaneously performed using the same material; and
the method further comprises a step of simultaneously performing frequency adjustment on the first and second band-pass filters.

19. An elastic wave device comprising:
a piezoelectric substrate;

a first band-pass filter including a plurality of first IDT electrodes disposed on the piezoelectric substrate, and a first dielectric film disposed on the piezoelectric substrate so as to cover the plurality of first IDT electrodes, the first band-pass filter including a pass band within a first communication band including a first transmit band and a first receive band, the pass band of the first band-pass filter corresponding to the first transmit band or the first receive band; and a second band-pass filter including a plurality of second IDT electrodes disposed on the piezoelectric substrate, and a second dielectric film disposed on the piezoelectric substrate so as to cover the plurality of second IDT electrodes, the second band-pass filter including a pass band within a second communication band different from the first communication band and including a second transmit band and a second receive band, the pass band of the second band-pass filter corresponding to the second transmit band or the second receive band; wherein at least one pair among a pair of the first and second IDT electrodes and a pair of the first and second dielectric films has the same or substantially the same film thickness and is made of the same material;

$|Tx1-Rx1|/f1 > |Tx2-Rx2|/f2$ wherein a frequency at an end of the first transmit band in the first communication band closest to the first receive band is represented by Tx1, a frequency at an end of the first receive band in the first communication band closest to the first transmit band is represented by Rx1, a center frequency of the pass band of the first band-pass filter is represented by f1, a frequency at an end of the second transmit band in the second communication band closest to the second receive band is represented by Tx2, a frequency at an end of the second receive band in the second communication band closest to the second transmit band is represented by Rx2, and a center frequency of the pass band of the second band-pass filter is represented by f2;

another pass band within the first communication band, among the first transmit band and the first receive band, is located in a lower frequency range than a frequency range of the pass band of the first band-pass filter;

another pass band within the second communication band, among the second transmit band and the second receive band, is located in a higher frequency range than a frequency range of the pass band of the second band-pass filter;

the first band-pass filter includes an input end and an output end, and includes one or more third elastic wave resonators that include at least one of elastic wave resonators connected between a series arm connecting the input end and the output end of the first band-pass filter to each other and a ground potential;

the second band-pass filter includes an input end and an output end, and includes one or more second elastic wave resonators that include at least one of elastic wave resonators disposed in a series arm connecting the input end and the output end of the second band-pass filter to each other; and a weighted average of duty ratios of the first IDT electrodes included in the one or more third elastic wave resonators is larger than a weighted average of duty ratios of the second IDT electrodes included in the one or more second elastic wave resonators.

20. The elastic wave device according to claim 19, wherein the duty ratios of the first IDT electrodes included in all of the one or more third elastic wave resonators are larger than the duty ratios of the second IDT electrodes included in all of the one or more second elastic wave resonators.

* * * * *